(12) United States Patent
Laackmann et al.

(10) Patent No.: US 9,279,856 B2
(45) Date of Patent: Mar. 8, 2016

(54) DIE, CHIP, METHOD FOR DRIVING A DIE OR A CHIP AND METHOD FOR MANUFACTURING A DIE OR A CHIP

(71) Applicant: Infineon Technologies AG, Neubiberg (DE)

(72) Inventors: Peter Laackmann, Munich (DE); Marcus Janke, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 493 days.

(21) Appl. No.: 13/656,761

(22) Filed: Oct. 22, 2012

(65) Prior Publication Data

US 2014/0111234 A1    Apr. 24, 2014

(51) Int. Cl.
    *G01R 31/3187*    (2006.01)
    *H01L 21/50*    (2006.01)
    *H01L 23/544*    (2006.01)
    *G01R 31/317*    (2006.01)

(52) U.S. Cl.
    CPC ... *G01R 31/31719* (2013.01); *H01L 2924/0002* (2013.01)

(58) Field of Classification Search
    None
    See application file for complete search history.

(56) References Cited

U.S. PATENT DOCUMENTS

| | | | |
|---|---|---|---|
| 7,681,103 B2 * | 3/2010 | Devadas et al. | 714/752 |
| 8,386,990 B1 * | 2/2013 | Trimberger et al. | 716/136 |
| 8,510,608 B2 * | 8/2013 | Futa | H03K 3/0315 708/251 |
| 8,525,169 B1 * | 9/2013 | Edelstein et al. | 257/48 |
| 8,583,710 B2 * | 11/2013 | Bucci et al. | 708/200 |
| 9,083,323 B2 * | 7/2015 | Guo | H03K 3/84 |
| 2007/0090312 A1 * | 4/2007 | Stallinga | G02B 27/48 250/580 |
| 2008/0231418 A1 * | 9/2008 | Ophey | G02B 27/00 340/5.85 |
| 2011/0234241 A1 * | 9/2011 | Lewis et al. | 324/649 |
| 2012/0131340 A1 * | 5/2012 | Teuwen | H04L 9/3278 713/168 |
| 2013/0194886 A1 * | 8/2013 | Schrijen | G06F 7/588 365/226 |
| 2013/0254636 A1 * | 9/2013 | Kirkpatrick | H04L 9/0866 714/784 |
| 2014/0100807 A1 * | 4/2014 | Rosenblatt et al. | 702/82 |
| 2014/0162464 A1 * | 6/2014 | Dimitrakopoulos et al. | 438/761 |
| 2015/0188718 A1 * | 7/2015 | Falk | G09C 1/00 380/278 |
| 2015/0192637 A1 * | 7/2015 | Falk | G06F 21/55 326/16 |
| 2015/0278527 A1 * | 10/2015 | Falk | G09C 1/00 726/25 |

* cited by examiner

*Primary Examiner* — Jermele M Hollington

(74) *Attorney, Agent, or Firm* — Viering, Jentschura & Partner

(57) ABSTRACT

In various embodiments, a die is provided. The die may include a physical unclonable function circuit configured to provide an output signal, wherein the output signal is dependent on at least one physical characteristic specific to the die; and a self-test circuit integrated with the physical unclonable function circuit on the die, wherein the self-test circuit is configured to provide at least one test input signal to the physical unclonable function circuit and to determine as to whether the output signal provided in response to the at least one test input signal fulfills a predefined criterion.

18 Claims, 4 Drawing Sheets

US 9,279,856 B2

DIE, CHIP, METHOD FOR DRIVING A DIE OR A CHIP AND METHOD FOR MANUFACTURING A DIE OR A CHIP

TECHNICAL FIELD

Various embodiments relate generally to a die and/or a chip having a circuit providing a function which provides an output signal in response to an input signal. Further, various embodiments relate generally to a method for driving a die and/or a chip and various embodiments relate generally to a method for manufacturing a die and/or a chip.

BACKGROUND

In practical cryptography, a Physical Unclonable Function or PUF is a function that is embodied in a physical structure of a die or a chip and may be easy to evaluate but hard to predict. An individual PUF circuit may be easy to make but hard to duplicate, even given the exact manufacturing process that produced it. PUF circuits may be configured to provide for example strong PUF's or weak PUF's.

A weak PUF is a circuit which produces a value, for example a key, wherein variations that occur in the production process are utilized to produce the value. The value is used in an algorithm which produces an output signal in response to an input signal, wherein the value influences the output signal.

Rather than embodying a single cryptographic key, strong PUFs implement challenge-response authentication. When a physical stimulus or input signal which corresponds to the challenge is applied to the structure, it reacts in an unpredictable way due to the complex interaction of the stimulus with the physical microstructure of the PUF circuit, wherein the reaction corresponds to the response. This exact microstructure depends on physical factors introduced during manufacture which are unpredictable. So, the strong PUF corresponds to a function which depends on the physical characteristics of the circuit providing the strong PUF.

Unclonability for example means in this context that each PUF device produces a unique and unpredictable key or has a unique and unpredictable way of mapping challenges to responses, even if it was manufactured with the same process as a similar chip or die, and it is infeasible to construct a PUF with the same key or challenge-response behavior as another given PUF because exact control over the manufacturing process is infeasible. This is because the key or the response is created by a complex interaction of the challenge with many or all of the random components. In other words, given the design of the PUF system, without knowing all of the physical properties of the random components, the keys and the responses are highly unpredictable.

SUMMARY

In various embodiments, a die is provided. The die may include a physical unclonable function circuit configured to provide an output signal in response to an input signal, wherein the function is dependent on at least one physical characteristic specific to the die; and a self-test circuit integrated with the physical unclonable function circuit on the die, wherein the self-test circuit is configured to provide at least one test input signal to the physical unclonable function circuit and to determine as to whether the output signal provided in response to the at least one test input signal fulfills a predefined criterion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
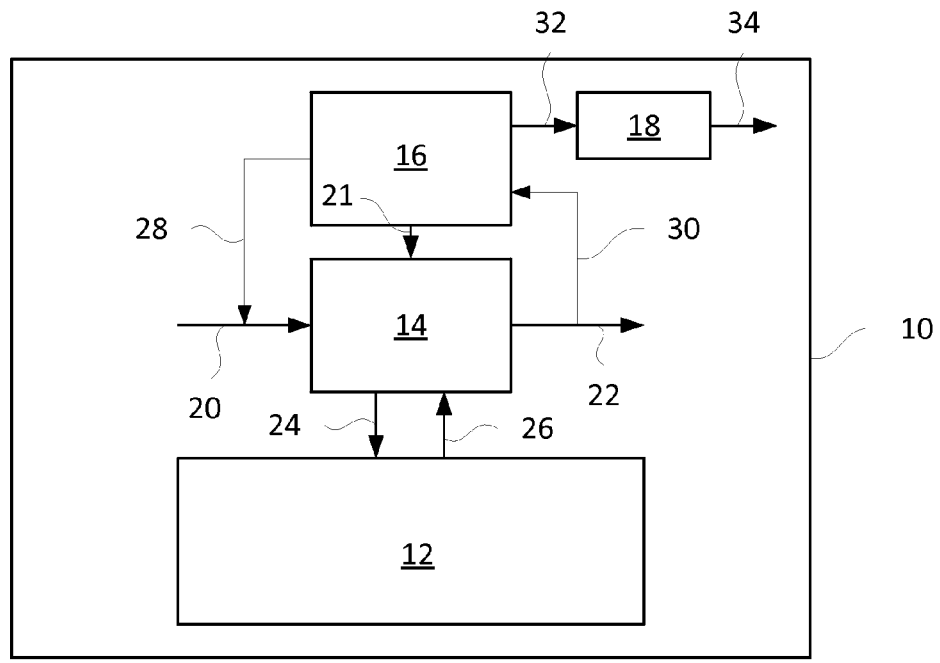
FIG. 1 shows an exemplary embodiment of a die.

FIG. 1 shows an embodiment of a die 10. For example, in various embodiments the die 10 may include or form a chip. The die 10 may have one or more integrated circuits. The die 10 for example may be called IC.

In various embodiments the die 10 has a circuitry 12 which may be a memory for storing information, a controller, a processor or any other integrated device. The die 10 may further have a physical unclonable function circuit 14. The circuitry 12 and the physical unclonable function circuit 14 may be implemented in hardware, for example on a substrate (not shown).

In an embodiment of the invention, the substrate (e.g. a wafer substrate) may be made of semiconductor materials of various types, including silicon, germanium, Group III to V or other types, including polymers, for example, although in another embodiment of the invention, other suitable materials can also be used. In an exemplary embodiment of the invention, the wafer substrate is made of silicon (doped or undoped), in an alternative embodiment of the invention, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

Further, in various embodiments the circuitry 12 and/or the physical unclonable function circuit 14 may be implemented as a FPGA under the control of software. The physical unclonable function circuit 14 may be implemented for example as a software running on a standard hardware, as a software running on a special hardware, by physical characteristics, for example a thickness of a layer, for example a cover-layer which may be measured for generating the key or the response, and/or as a special hardware, for example as a SRAM, one ore more oszillators, delay-lines etc. The layer may for example be a passivation layer providing a capacitive surface. The physical unclonable function circuit 14 may be configured to provide a generator 40 (see FIG. 2) providing a value 23 which may be used for generating an output signal 22 in response to an input signal 20 or to provide a function providing the output signal 22 in response to the input signal 20 (see FIG. 3), wherein the generator 40 or the function are dependent on at least one physical characteristic specific to the die 10 and/or at least one physical characteristic specific to the manufacturing of the die 10 or the chip. The output signal 22 may for example be a coded output signal, for example a unique coding output signal. Typical applications of the physical unclonable function circuit 14 may lie in security tasks such as tamper protection, intellectual property protection, read-proof memory, and/or key obfuscation. They can also be used for classical cryptographic protocols such as key distribution or bit commitment.

The die 10 may further have a self-test circuit 16 which is, for example monolithically, integrated with the physical unclonable function circuit 16 on the same die 10, wherein the self-test circuit 16 may be configured to provide one or more test input signals 21, 28 to the physical unclonable function circuit 14 to determine as to whether the output signal 22 provided in a response 30 to the test input signals 21, 28 fulfills a predefined criterion or whether the output signal 22 corresponds to a predefined behavior. In this context a first test input signal 21 may modify the generator 40 or the function and/or a second test input signal 28 may be called challenge or stimulus and/or may comprise a predefined bit pattern.

The circuitry 12 and the physical unclonable function circuit 14 in various embodiments may have different electronic components or may have the same or at least in part the same electronic components. In other words, the physical unclonable function 14 may be a part of the circuitry 12 and/or may use at least some of the electronic components of the circuitry 12 to provide the generator 40 or the function for providing the output signal 22. The electronic components may be at least one of a logical gate, a transistor, a capacitor, a resistance, a diode and/or vias or wires connecting other electronic components. Values of the electronic components used for the generator 40 or the function of the physical unclonable function circuit 14, for example used as parameters of the function, are in various embodiments at least one of a delay, a voltage, a threshold voltage, a capacitance, etc. of the corresponding electronic elements, for example of the logical gate, the transistor, the capacitor, the resistance, the diode and/or the vias or wires. If the circuitry 12 and the physical unclonable function circuit 14 have different electronic components the circuitry 12 and the physical unclonable function circuit 14 may communicate via a first signal 24 supplied from the physical unclonable function circuit 14 to the circuitry and/or a second signal 26 supplied from the circuitry 12 to the physical unclonable function circuit 14.

Figure 2:
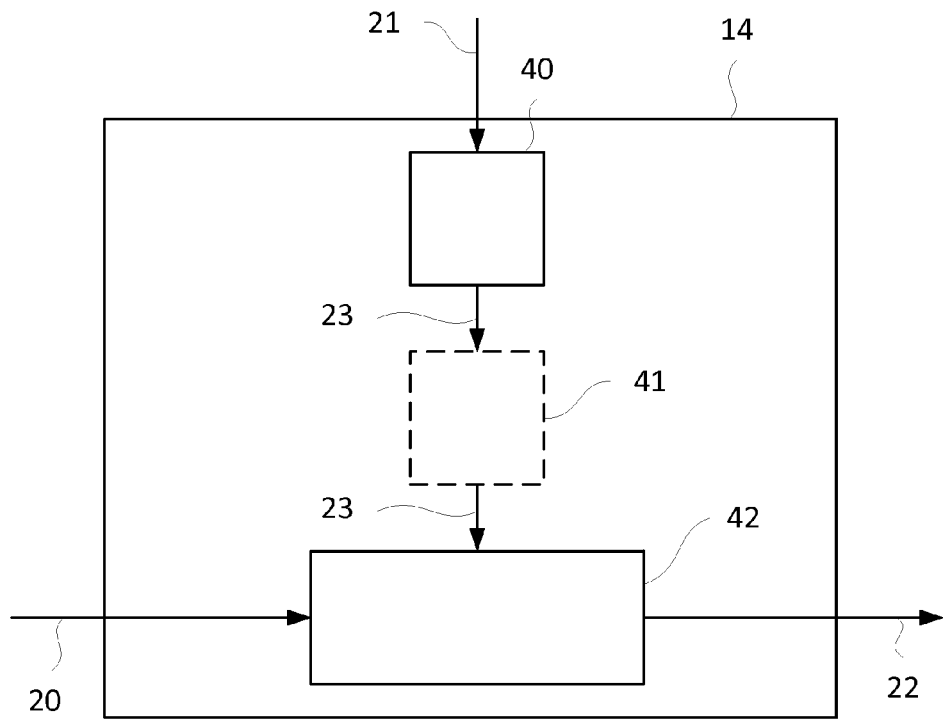
FIG. 2 shows an exemplary embodiment of a physical unclonable function circuit.

FIG. 2 shows an embodiment of the physical unclonable function circuit 14. The physical unclonable function circuit 14 in various embodiments may for example have the generation block 40, an algorithm, and an optional evaluation block 41. The generation block 40 may include the electronic components providing the core of the physical unclonable function circuit 14. The generation block 40 may generate a value 23, for example represented by a series of bits. The generation of the value 23 may be dependent on the physical characteristics of the generation block 40. Further, the generation of the value 23 may be influenced by the first test input signal 21. For example the way the value 23 is generated may be modified and/or the value 23 may be generated dependent on the first test input signal 32. For example the value 23 represents the first test input signal 21 or the value 23 may be varied by the first test input signal 21, for example by varying some generation parameters. The generated value 23 may be supplied to the evaluation block 41 which may for example carry out one or more logical operations and/or cryptographic operations on the supplied signal. The evaluation block 41 may output a modified value 25 dependent on the result of the logical and, respectively, cryptographic operations. The value 23 or the modified value 25 may be input into an algorithm 42 which generates the output signal 22 in response to the input signal 20, which may correspond to the test input signal 28. The output signal 22 is generated dependent on the value 23 which is generated dependent on the physical characteristics of the die 10. Therefore, also the output signal 22 is generated dependent on physical characteristics of the die. The number of different challenge-response pairs of the physical unclonable function circuit 14 according to FIG. 2 may be relatively small. Therefore, the physical unclonable function circuit 14 according to FIG. 2 may be called weak physical unclonable function circuit 14.

Figure 3:
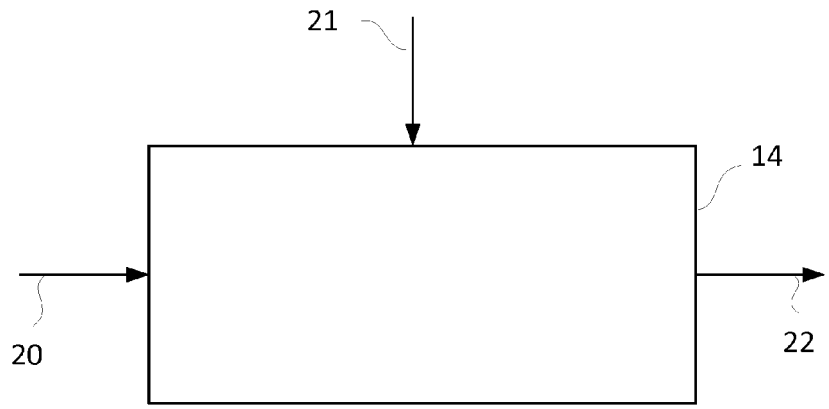
FIG. 3 shows an exemplary embodiment of a physical unclonable function circuit.

FIG. 3 shows another exemplary embodiment of the physical unclonable function circuit 14. The physical unclonable function circuit 14 in various embodiments may for example comprise a function which generates the output signal 22 in response to the input signal 20. The physical unclonable function circuit 14 may include the electronic components providing the function of the physical unclonable function circuit 14. The function may receive the test input signal 28. The function may generate the output signal 22 and may put it out. The number of possible challenge-response pairs available for the physical unclonable function circuit 14 according to FIG. 3 is relatively large, in particular larger than the number of possible pairs for the weak physical unclonable function circuit 14 according to FIG. 2, so that the physical unclonable function circuit 14 according to FIG. 3 may be called a strong physical unclonable function circuit 14.

The challenge in various embodiments may create two paths through the circuitry 12 and/or physical unclonable function circuit 14, in particular through the corresponding electronic components, that are simultaneously stimulated in the same way, for example by the input signal 20. For example, in a theoretically perfect system, the stimulation should cause a certain reaction at the end of both paths having exact the same path delay. However, actually, because of slight differences of the electronic components in both paths, which are typically for each die 10, the digital reaction occurs with different path delays in both paths. The output signal 22 and/or the response 30 may be based on a (timing) comparison of the path delays. The path delays in a die 10 are statistically distributed due to the random manufacturing variations.

Alternatively or additionally, in various embodiments the physical unclonable function circuit 14 has at least two ring oscillators, for examples ring oscillators of the circuitry 12, which may for example be used to generate clock signals in the die 10. In general each ring oscillator has a unique frequency even if many oscillators are fabricated from the same mask. The physical unclonable function circuit 14 may compare the frequencies of two of the oscillators and the faster oscillator is randomly determined by manufacturing variations of the die 10. The exact frequencies of many of the oscillators of a die 10 have a statistical oscillator frequency distribution, for example a Gaussian-like distribution.

In various embodiments some of the electronic parts of the physical unclonable function circuit 14 and/or the circuitry 12 may form a semiconductor memory, for example a SRAM (Static Random Access Memory) formed by CMOS transistors, e.g. field effect transistors (FET), e.g. metal-oxide semiconductor FETs (MOSFETs), e.g. complementary MOSFETs (CMOSFETs). The SRAM is based on a bi-stable latch which will retain its value as long as the circuit is powered. Each bit is provided by e.g. a circuit comprising six transistors, arranged as two cross-coupled inverters and two access switches. This circuit has two stable states to represent either a logic zero or a logic one and thus a bit. There are two additional transistors which are known as access transistors since they control the access to the storage cell during write and read operations. In order to read or write to the cell a word line is enabled. This will connect the two access transistors. When the SRAM is off, the input to each inverter is zero. However, due to the function of an inverter this is an unstable state which changes once the SRAM is turned on. The two inputs become either zero-one or one-zero. Which state is taken on is dependent on the characteristics of the transistors making up each cell of the SRAM and is therefore typical for each die 10. Although ideally each transistor should be identical, in practice they slightly vary due to uncontrollable factors in the manufacturing process such as dopant concentrations. Variations in the threshold voltages of the transistors may cause each cell to tend towards one or zero. The distribution to tend in one or the other direction of many of the cells again has a statistical character.

The die 10 in various embodiments may further have an error handling circuit 18 (see FIG. 1) coupled to the self-test circuit 16 and configured to carry out an error handling process in case the self-test circuit 16 determines that the output signal 22 provided in the response 30 to the at least one test input signal 28 does not fulfill a predefined criterion. Optionally the error handling circuit 18 is configured to output an error signal 34 which may be an alarm signal indicating an external system that an error has been detected in the physical unclonable function circuit 14 and/or which may be a reset signal to set the die 10 into a predefined reset state, which may be a predefined security reset state, or the physical unclonable function may be deactivated, wherein in this case no more data are delivered and/or requests are blocked, or the die 10 may be deactivated, wherein in this case the die 10 does not react on any requests and/or the die is in a secure state, or the physical unclonable function may be relaunched, wherein in this case a self-test may be initiated after rebooting, or one or more parameters of the physical unclonable function 14 and/or the die 10 are deleted, what may render the physical unclonable function 14 and/or the die 10 useless.

In various embodiments, the self-test circuit 16 may be configured to provide a at least one test input signal 21, 28 to the physical unclonable function circuit 14 and to evaluate the output signal 22 respectively provided in the response 30 to the test input signal 21, 28 and to determine as to whether the output signal 22 fulfills the predefined criterion. In other words, the self-test circuit generates different stimuli which cause the electronic components of the physical unclonable function circuit 14 to generate output signals 22, for example in this context the physical unclonable function circuit 14 operates similar to a random number generator, which are subjected to an hardware based entropy analysis, which for example corresponds to a quality control of a random number generator. The stimuli and/or the test input signals 21, 28 may be generated by a random number generator of the self-test circuit 16.

In various embodiments, the predefined criterion may be a deviation from the typical statistical distribution of some of the output signals 22.

In various embodiments, the self-test circuit 16 may also be configured to provide a plurality of different test input signals 21, 28 to the physical unclonable function circuit 14 and to evaluate the plurality of output signals 22 respectively provided in the response 30 to the plurality of different test input signals 21, 28 and to determine as to whether the output signals 22 fulfill the predefined criterion.

Alternatively or additionally, in various embodiments the self-test circuit 16 is configured to change the function provided by the physical unclonable function circuit 14, for example with the help of the first test input signal 21, and to provide at least one second test input signal 28 to the physical unclonable function circuit 14 before the change and to provide at least one second test input signal 28 to the physical unclonable function circuit 14 after the change, and to determine as to whether the respectively output signal 22 fulfills the predefined criterion. The changing of the function in various embodiments may simulate an external security attack, e.g. by making sure that at least a portion of the output signal 22 always has a fixed value (e.g. always "1" or always "0"). For example, the key generated by the physical unclonable function circuit 14 may thus be weaker as it normally should be, because the number of randomized bits is reduced thus the key is shorter.

In various embodiments the generator 40 or function may be changed by changing the paths which are stimulated for monitoring and comparing the path delays, so that the output signal 22 varies even if the same first test input signal 28 is applied to the physical unclonable function circuit 14. Further, in various embodiments the generator 40 or the function may be changed by changing the oscillators which are stimulated for monitoring and comparing the frequencies of the oscillators, for example with the help of the first test input signal 21, so that the output signal 22 varies even if the same second test input signal 28 is applied to the physical unclonable function circuit 14. Further, in various embodiments the function may by changed be changing some threshold voltages of transistors for monitoring and comparing the logical state they normally would have, so that the output signal 22 varies even if the same second test input signal 28 is applied to the physical unclonable function circuit 14. Further, in various embodiments some special bit-combinations are written in the SRAM and the output signal 22 at least in part influenced by this special bit-combinations may be evaluated.

The self-test circuit 16 in various embodiments may optionally be configured to provide the at least one test input signal 21, 28 to the physical unclonable function circuit 14 and to determine as to whether the output signal 22 provided in the response 30 to the at least one test input signal 21, 28 fulfills the predefined criterion in response to the occurrence of a predefined event. The predefined event may for example be the start-up of the die 10 and/or the activation of the physical unclonable function circuit 14 and/or an access request to a security-related function of the die 10. The security-related function may be a coding, a scrambling and/or a key generation.

Figure 4:
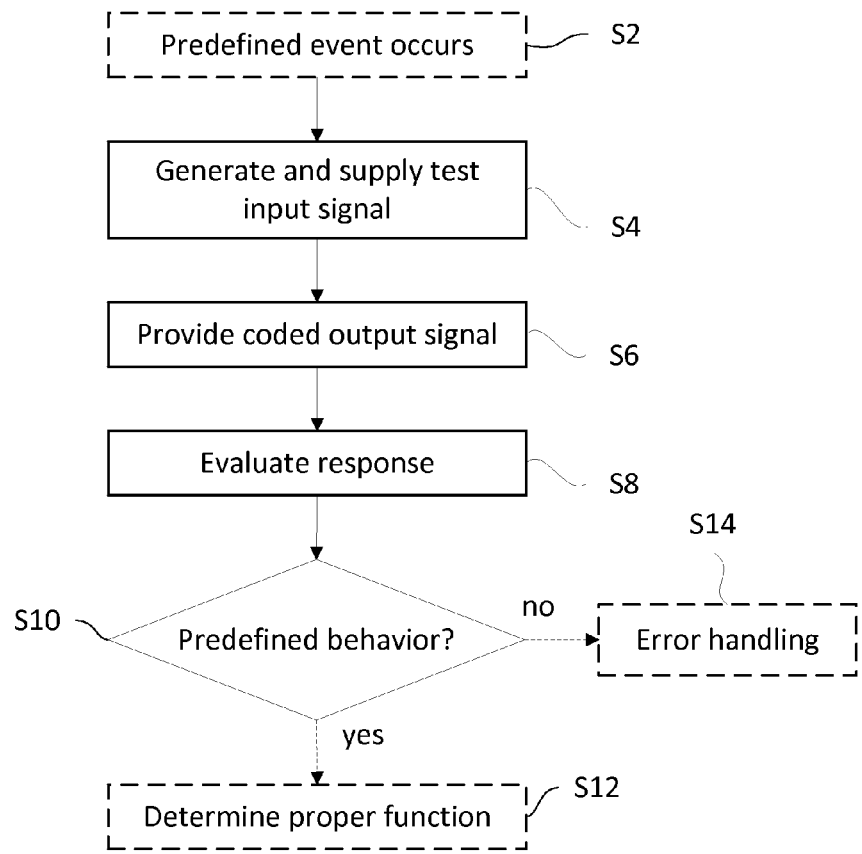
FIG. 4 shows a flowchart of an exemplary embodiment of a method for driving a die.

FIG. 4 shows a flowchart of an embodiment of a method for driving a die, for example the die 10 or chip in accordance with FIGS. 1 to 3.

In an optional process S2 a predefined event occurs. The predefined event may for example be the start-up of the die 10 and/or the activation of the physical unclonable function circuit 14 and/or an access request to a security-related function of the die 10.

In S4, at least one test input signal 21, 28, for example a plurality of test input signals 21, 28 are generated by the self-test circuit 16 and are supplied to the physical unclonable function circuit 14.

In S6, the output signal 22 is provided in response to the test input signals 21, 28 by the physical unclonable function circuit 14.

In S8, the response 30 corresponding to the output signal 22 is evaluated by the self-test circuit 16. For example, the distribution of different output signals 22 is determined.

In S10, it is determined as to whether the output signal 22 provided in the response 30 to the at least one test input signal 20 fulfills the predefined criterion or whether the output signal 22 corresponds to the predefined behavior. For example, it is checked whether different test input signals 21, 28 lead to different output signals 22 when using the same physical unclonable function circuit 14. Alternatively, it is checked whether the evaluated distribution of the output signals 22 correspond to a certain statistical distribution, for example a Gaussian distribution, in response to the test input signals 21, 28 when varying the test input signals 21, 28. If the condition of S10 is fulfilled, the method proceeds in S12. If the condition of S10 is not fulfilled, the method proceeds in S14.

In S12, the physical unclonable function circuit 14 is determined as functioning properly. If in step S2 the predefined event occurs which in this case triggers the start of this method, the predefined event proceeds, i.e. for example the die 10 is started or the physical unclonable function circuit 14 is activated or access is given to the security-related function of the die 10, respectively.

In S14, an error handling process is carried out, for example by the error handling circuit 18. The error handling process for example leads to an output of the error signal 34 which may be an alarm signal indicating an external system that an error has been detected in the physical unclonable function circuit 14 and/or which may be a reset signal to set the die 10 into a predefined reset state. Further, if in S2 the predefined event occurs which in this case triggers the start of this method, the predefined event may be stopped, i.e. for example the die 10 is not started or the physical unclonable function circuit 14 is deactivated or no access is given to the security-related function of the die 10, respectively.

Figure 5:
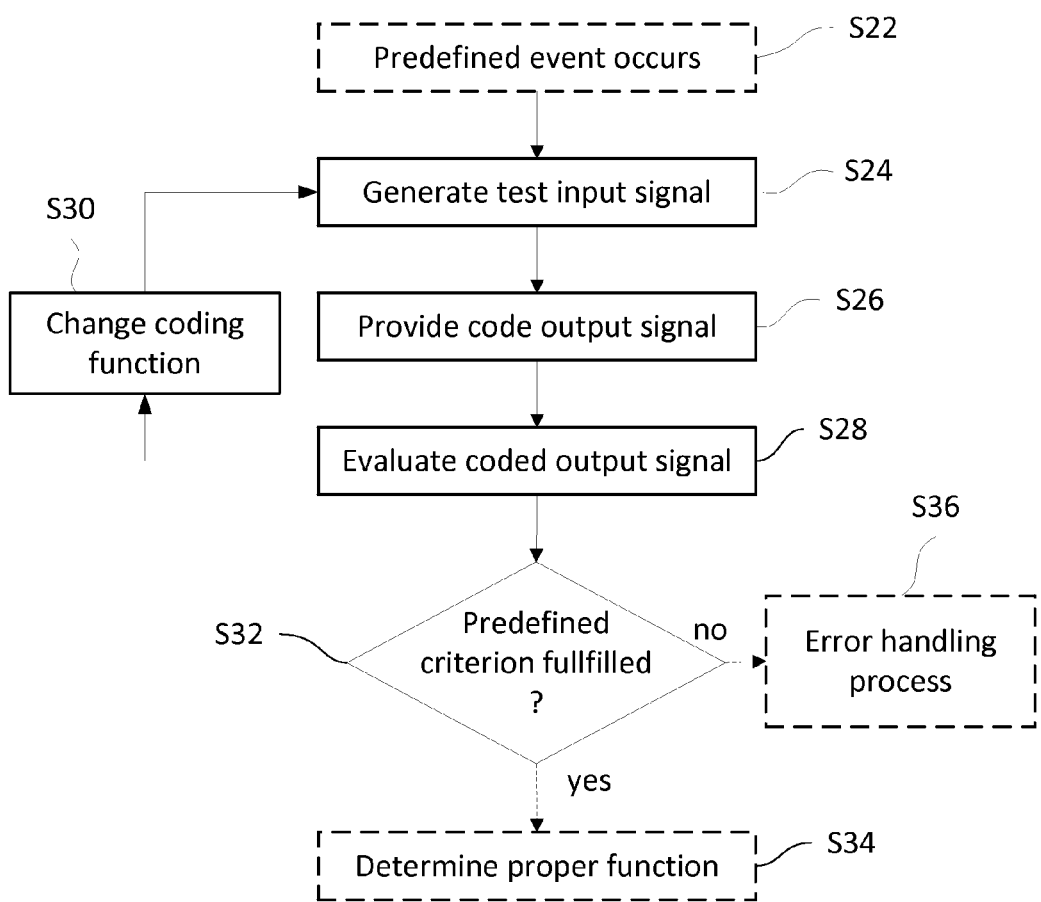
FIG. 5 shows a flowchart of an exemplary embodiment of a method for driving a die.

FIG. 5 shows a flowchart of another embodiment of a method for driving a die, for example the die 10 or chip in accordance with FIGS. 1 to 3.

In an optional process S22 the predefined event occurs. The predefined event may for example be the start-up of the die 10 and/or the activation of the physical unclonable function circuit 14 and/or an access request to a security-related function of the die 10.

In S24, at least one test input signal 21, 28 is generated by the self-test circuit 16 and is supplied to the physical unclonable function circuit 14.

In S26, the output signal 22 is provided in response to the test-input signal 21, 28 by the physical unclonable function circuit 14.

In S28, the response 30 corresponding to the output signal 22 is evaluated by the self-test circuit 16. For example, the distribution of different output signals 22 is determined.

In S30, the function of the physical unclonable function circuit 14 is changed. S24 to S30 may be repeated several times.

In S32, it is determined as to whether the output signal 22 provided in the response 30 to the at least one test input signal 21, 28 fulfills the predefined criterion or whether the output signal 22 corresponds to the predefined behavior. For example, it is evaluated whether the same second test input signals 28 lead to different output signals 22 when varying the generator 40 or function of the physical unclonable function circuit 14, for example with the help of the first test input signal 21. Alternatively, it is evaluated whether the output signals 22 have a certain statistical distribution in response to the test-input signals 28 when varying the generator 40 or the function of the physical unclonable function circuit 14. If the condition of S32 is fulfilled, the method proceeds in S34. If the condition of S32 is not fulfilled, the method proceeds in S36.

In S34, the physical unclonable function circuit 14 is determined as functioning properly. If in S22 the predefined event occurs which in this case triggers the start of this method, the predefined event proceeds, i.e. for example the die 10 is started or the physical unclonable function circuit 14 is activated or access is given to the security-related function of the die 10, respectively.

In S36, an error handling process is carried out, for example by the error handling circuit 18. The error handling process for example leads to an output of the error signal 34 which may be an alarm signal indicating an external system that an error has been detected in the physical unclonable function circuit 14 and/or which may be a reset signal to set the die 10 into a predefined reset state. Further, if in S22 the predefined event occurs which in this case triggers the start of this method, the predefined event is stopped, i.e. for example the die 10 is not started or the physical unclonable function circuit 14 is deactivated or no access is given to the security-related function of the die 10, respectively.

Figure 6:
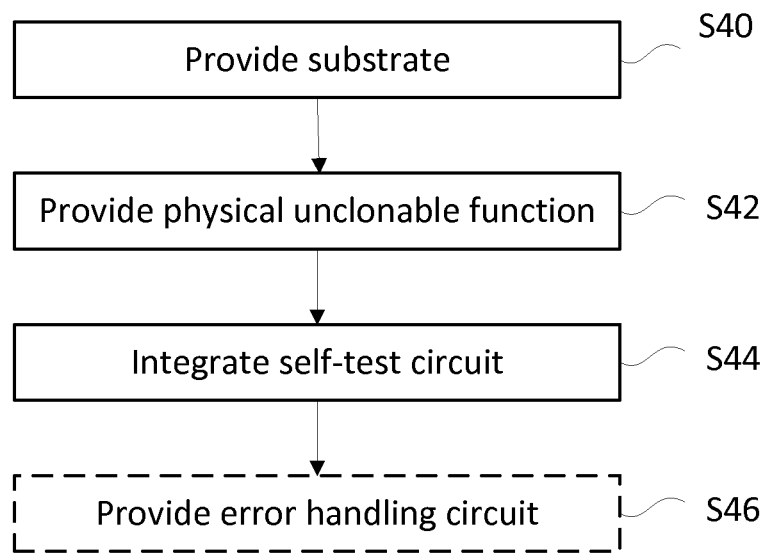
FIG. 6 shows a flowchart of an exemplary embodiment of a method for manufacturing a die.

FIG. 6 shows a flowchart of an exemplary embodiment of a method for manufacturing a die, for example the die 10 or the chip in accordance with FIGS. 1 to 3.

In S40, a substrate is provided. The substrate may have a semiconductor material and/or an insulating material. The substrate may be a wafer and/or may comprise a material as stated above.

In S42, the physical unclonable function circuit 14 is provided on the substrate. The physical unclonable function circuit 14 is configured such that it is able to provide the output signal 22, wherein the output signal 22 is dependent on at least one physical characteristic specific to the die 10 or the chip, respectively. The physical unclonable function circuit 14 may be provided by forming several layers on the substrate and by forming several structures in the layers, for example by known photolithographic processes and/or etching processes. The formed structures may form the electronic components of the physical unclonable function circuit 14.

In S44, the self-test circuit 16 is, for example monolithically, integrated with the physical unclonable function circuit 14 on or in the die 10. The self-test circuit 16 may configured such that it is able to provide at least one test input signal 21, 28 to the physical unclonable function circuit 14 and to determine as to whether the output signal 22 provided in the response 30 fulfills the predefined criterion. The self-test circuit 16 may be formed in the same or in different manufacturing processes as the physical unclonable function circuit 14. In other words, S42 and S44 may be carried out simultaneously or one after the other.

In an optional process S46 the error handling circuit 18 may be formed on the substrate. The error handling circuit 18 may be monolithically integrated with the physical unclonable function circuit 14 and/or the self-test circuit 16 on the die 10. The error handling circuit 16 is configured such that it carries out the error handling process in case the output signal 22 does not fulfill the predefined criterion. The error handling circuit 18 may be formed in the same or in different manufacturing processes as the physical unclonable function circuit 14 and/or self-test circuit 16. In other words, S46 and S42 and/or S44 may be carried out simultaneously or one after the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die, comprising:
a physical unclonable function circuit providing output signals, wherein the output signals are dependent on at least one physical characteristic specific to the die;
a self-test circuit integrated with the physical unclonable function circuit on the die, wherein the self-test circuit provides a plurality of test input signals to the physical unclonable function circuit, evaluates the output signals respectively provided in response to the plurality of test input signals, and determines as to whether the output signals provided in response to the plurality of test input signals fulfill a predefined criterion, wherein the predefined criterion is that different test input signals lead to different output signals when using the same physical unclonable function circuit and/or that the same test input signals lead to different output signals when varying a function of the physical unclonable function circuit; and
an error handling circuit coupled to the self-test circuit, wherein the error handling circuit outputs an alarm signal indicating that an error has been detected in the physical unclonable function circuit and/or a reset signal to set the die into a predefined reset state in case the self-test circuit determines that the output signals provided in response to the plurality of test input signals do not fulfill the predefined criterion.

2. The die of claim 1,
wherein the self-test circuit provides the plurality of test input signals to the physical unclonable function circuit and determines as to whether the output signals provided in response to the plurality of test input signals fulfill the predefined criterion in response to the occurrence of a predefined event.

3. The die of claim 2,
wherein the predefined event is the start-up of the die.

4. The die of claim 2,
wherein the predefined event is the activation of the physical unclonable function circuit.

5. The die of claim 2,
wherein the predefined event is an access request to a security-related function of the die.

6. The die of claim 1,
wherein the physical unclonable function circuit is configured to provide a strong or a weak physical unclonable function.

7. The die of claim 1,
wherein the self-test circuit is monolithically integrated with the physical unclonable function circuit.

8. The die of claim 1,
wherein, when different test input signals lead to different output signals, when using the same physical unclonable function circuit, the self-test circuit evaluates the plurality of output signals by determining their distribution, and
wherein the predefined criterion is that the determined distribution of the different output signals corresponds to a certain statistical distribution.

9. A chip, comprising:
a circuit providing output signals dependent on at least one physical characteristic specific to the manufacturing of the chip by the use of a physical unclonable function;
a self-test circuit, wherein the self-test circuit provides a plurality of test input signals to the circuit, evaluates the output signals respectively provided in response to the plurality of test input signals, and determines as to whether the output signals provided in response to the plurality of test input signals correspond to a predefined behavior, wherein the predefined behavior is that different test input signals lead to different output signals when using the same physical unclonable function circuit and/or that the same test input signals lead to different output signals when varying a function of the physical unclonable function circuit; and
an error handling circuit coupled to the self-test circuit, wherein the error handling circuit outputs an alarm signal indicating that an error has been detected in the circuit and/or outputs a reset signal to set the chip into a predefined reset state in case the self-test circuit determines that the output signals provided in response to the plurality of test input signals do not correspond to the predefined behavior.

10. The chip of claim 9,
wherein the self-test circuit provides the plurality of test input signals to the circuit and determines as to whether the output signals provided in response to the plurality of test input signals correspond to the predefined behavior in response to the occurrence of a predefined event.

11. The chip of claim 10,
wherein the predefined event is the start-up of the chip.

12. The chip of claim 10,
wherein the predefined event is the activation of the circuit.

13. The chip of claim 10,
wherein the predefined event is an access request to a security-related function of the chip.

14. The chip of claim 9,
wherein the circuit is configured to provide a strong or a weak physical unclonable function.

15. The chip of claim 9,
wherein the self-test circuit is monolithically integrated in the circuit.

16. The die of claim 9,
wherein, when different test input signals lead to different output signals, when using the same physical unclonable function circuit, the self-test circuit evaluates the plurality of output signals by determining their distribution, and
wherein the predefined criterion is that the determined distribution of the different output signals corresponds to a certain statistical distribution.

17. Method for driving a die, comprising the steps of:
providing a plurality of test input signals by a self-test circuit to a physical unclonable function circuit, wherein the self-test circuit and the physical unclonable function circuit are integrated on the die, providing output signals in response to the plurality of test-input signals by the physical unclonable function circuit, wherein the output signals are dependent on at least one physical characteristic specific to the die;

evaluating the output signals respectively provided in response to the plurality of different test input signals;

determining as to whether the output signals provided in response to the plurality of test input signals fulfill a predefined criterion, wherein the predefined criterion is that different test input signals lead to different output signals when using the same physical unclonable function circuit and/or that the same test input signals lead to different output signals when varying a function of the physical unclonable function circuit; and outputting an alarm signal indicating that an error has been detected in the physical unclonable function circuit and/or a reset signal to set the die into a predefined reset state by an error handling circuit coupled to the self-test circuit in case the self-test circuit determines that the output signals provided in response to the plurality of test input signals do not fulfill the predefined criterion.

18. Method for driving a chip, comprising the steps of:

providing a plurality of test input signals by a self-test circuit to a circuit, wherein the self-test circuit and the circuit are integrated on the chip, providing output signals in response to the test-input signals, wherein the output signals are dependent on at least one physical characteristic specific to the chip;

evaluating the output signals respectively provided in response to the plurality of test input signals;

determining as to whether the output signals provided in response to the plurality of test input signals correspond to a predefined behavior, wherein the predefined behavior is that different test input signals lead to different output signals when using the same physical unclonable function circuit and/or that the same test input signals lead to different output signals when varying a function of the physical unclonable function circuit; and outputting an alarm signal indicating that an error has been detected in the circuit and/or a reset signal to set the chip into a predefined reset state by an error handling circuit coupled to the self-test circuit in case the self-test circuit determines that the output signals provided in response to the plurality of test input signals do not correspond to the predefined behavior.

* * * * *